(12) United States Patent
Kim et al.

(10) Patent No.: US 11,688,453 B2
(45) Date of Patent: Jun. 27, 2023

(54) MEMORY DEVICE, MEMORY SYSTEM AND OPERATING METHOD

(71) Applicant: SAMSUNG ELECTRONICS CO., LTD., Suwon-si (KR)

(72) Inventors: Taek Woon Kim, Seongnam-si (KR); Jang Seok Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/500,095

(22) Filed: Oct. 13, 2021

(65) Prior Publication Data

US 2022/0246201 A1 Aug. 4, 2022

(30) Foreign Application Priority Data

Feb. 2, 2021 (KR) .................. 10-2021-0014700

(51) Int. Cl.
*G11C 11/406* (2006.01)
*G11C 29/44* (2006.01)
*G11C 11/4093* (2006.01)
*G11C 11/408* (2006.01)

(52) U.S. Cl.
CPC .... *G11C 11/40615* (2013.01); *G11C 11/4087* (2013.01); *G11C 11/4093* (2013.01); *G11C 11/40622* (2013.01); *G11C 29/4401* (2013.01)

(58) Field of Classification Search
CPC ........ G11C 11/40615; G11C 11/40622; G11C 11/4087; G11C 11/4093; G11C 29/4401
USPC .......................................................... 365/222
See application file for complete search history.

(56) References Cited

U.S. PATENT DOCUMENTS

| | | | |
|---|---|---|---|
| 6,633,952 B2 | 10/2003 | Winograd et al. | |
| 7,107,390 B2 | 9/2006 | Teng | |
| 9,032,141 B2 * | 5/2015 | Bains | G06F 13/1636 |
| | | | 711/106 |
| 9,087,602 B2 | 7/2015 | Youn et al. | |
| 9,236,110 B2 * | 1/2016 | Bains | G11C 11/40618 |
| 9,286,965 B2 | 3/2016 | Perego et al. | |
| 9,324,398 B2 * | 4/2016 | Jones | G11C 8/10 |
| 9,449,671 B2 * | 9/2016 | Crawford | G06F 13/1636 |
| 9,721,643 B2 * | 8/2017 | Bains | G11C 29/50012 |
| 9,824,740 B2 | 11/2017 | Ware et al. | |
| 10,115,448 B2 | 10/2018 | Lee et al. | |
| 10,916,293 B1 * | 2/2021 | Lai | G11C 11/4078 |
| 11,139,015 B2 * | 10/2021 | Brown | G11C 11/408 |

FOREIGN PATENT DOCUMENTS

KR 1558482 B1 10/2015

\* cited by examiner

*Primary Examiner* — Son L Mai
(74) *Attorney, Agent, or Firm* — Volentine, Whitt & Francos, PLLC

(57) ABSTRACT

A method of operating a memory device includes; receiving a refresh command, performing a refresh operation on a target row of a bank memory array, and providing status information to a memory controller for an adjacent row, relative to the target row, during a refresh operation period defining a refresh operation performed by the memory device.

20 Claims, 10 Drawing Sheets

| RH Level (TH$_{RH}$) | Status Info1 | Action |
|---|---|---|
| 0% | 00 | - |
| 25% | 01 | - |
| 50% | 10 | Refresh Row (n ± 1) |
| 75% | 11 | Refresh Row (n ± 1) and Row (n ± 2) |

| Error Level ($TH_e$) | Status Info2 | Action |
|---|---|---|
| 0% | 00 | - |
| 25% | 01 | - |
| 50% | 10 | Scrubbing Row n |
| 75% | 11 | Scrubbing Bank of Row n |

MEMORY DEVICE, MEMORY SYSTEM AND OPERATING METHOD

CROSS-REFERENCE TO RELATED APPLICATION

This application claims priority under 35 U.S.C. § 119 to Korean Patent Application No. 10-2021-0014700, filed on Feb. 2, 2021 in the Korean Intellectual Property Office, the disclosure of which is incorporated by reference herein in its entirety.

BACKGROUND

1. Field of the Invention

The inventive concept relates generally memory devices. More particularly, the inventive concept relates to memory devices capable of performing an efficient refresh operation, operating methods for such memory devices, and memory systems including such memory devices.

2. Description of the Related Art

Semiconductor memory devices may be broadly classified as volatile memory devices and non-volatile memory devices. Volatile memory devices (e.g., dynamic random access memory (DRAM)) rapidly store data by charging or discharging of cell capacitors, but lose stored data in the absence of applied power. In contrast, non-volatile memory devices retain stored data in the absence of applied power. Volatile memory devices are often used as a main memory for computers and similar digital platforms. Non-volatile memory devices are often used as a large-capacity memory for storing program and/or data in a broad range of devices such as computers, mobile communication devices, etc.

The electrical charge stored in the cell capacitor of a volatile memory device (e.g., DRAM) may gradually decrease due to leakage current. Thus, before the level of electrical charge falls below a coherency threshold and stored data is lost, the memory cell must be recharged. This recharging of memory cells to retain stored data in a volatile memory device is referred to as a refresh operation, and refresh operations must be repeatedly performed so long as the volatile memory device remains in operation.

SUMMARY

With continued development of advanced semiconductor processing technique enabling greater integration density, the intervals separating adjacent and proximate volatile memory cells has gradually decreased. Such decreased memory cell intervals exacerbate the problem of memory cell disturbances caused by activation (or driving) of the adjacent and proximate memory cells. Further, even when disturbances are concentrated around a specific memory cell, it is difficult to restrict access to a corresponding address during operation of the volatile memory device (e.g., a DRAM). Therefore, memory cell disturbances may occur and adversely affect refresh characteristics of the memory cells in a memory cell array.

Aspects of the inventive concept provide a memory device, a memory system and related method of operating same capable of performing a refresh operation during which status information may be obtained.

In one embodiment, the inventive concept provides a memory device including; a bank memory array including memory cells, a control unit configured to indicate a target row of the bank memory array in response to a refresh command received from an external source, a refresh control circuit that provides a refresh row address in response to the control unit indicating the target row, a row decoder that applies a refresh drive voltage to memory cells of the target row in response to the refresh row address, a status monitor that monitors row-specific status information for memory cells of the target row, a status register that stores the status information under control of the status monitor, and a data input/output (I/O) buffer that receives the status information from the status register and provides the status information to the external source in response to the refresh command.

In another embodiment, the inventive concept provides a memory system including a memory controller issuing a first refresh command and a memory device. The memory devices includes; a bank memory array including memory cells, a control unit configured to indicate a target row of the bank memory array in response to the first refresh command, a refresh control circuit that provides a refresh row address in response to the control unit indicating the target row, a row decoder that applies a refresh drive voltage to memory cells of the target row in response to the refresh row address, a status monitor that monitors row-specific status information for memory cells of the target row, a status register that stores the status information under control of the status monitor, and a data input/output (I/O) buffer that receives the status information from the status register and provides the status information to the memory controller in response to the first refresh command, wherein the status information includes at least one of a row hammer level and a bit error level.

In another embodiment, the inventive concept provides a method of operating a memory device, the method including; receiving a refresh command, performing a refresh operation on a target row of a bank memory array, and providing status information to a memory controller for an adjacent row, relative to the target row, during a refresh operation period defining a refresh operation performed by the memory device.

BRIEF DESCRIPTION OF THE DRAWINGS

The making and use of the inventive concept will be described hereafter with reference to the accompanying drawings, in which.

DETAILED DESCRIPTION

Throughout the written description and drawings, like reference numbers and labels will be used to denote like or similar elements, features and/or method steps.

Figure 1A:
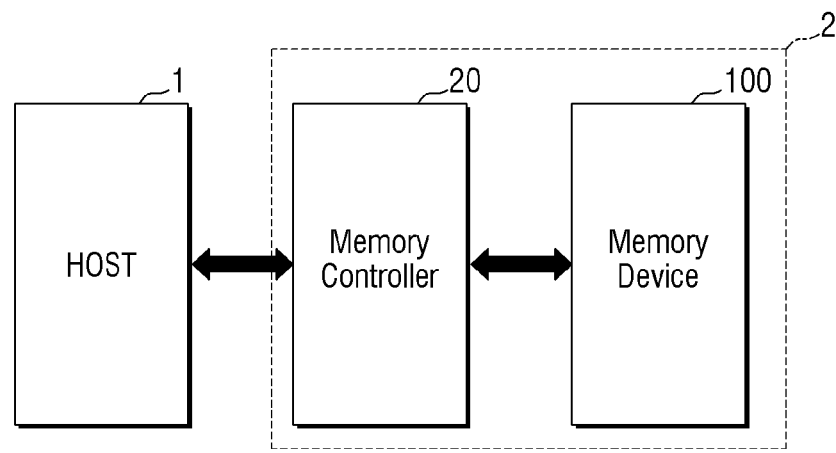
FIGS. 1a and 1b are block diagrams illustrating an electronic system according to embodiments of the inventive concept.
Figure 1B:
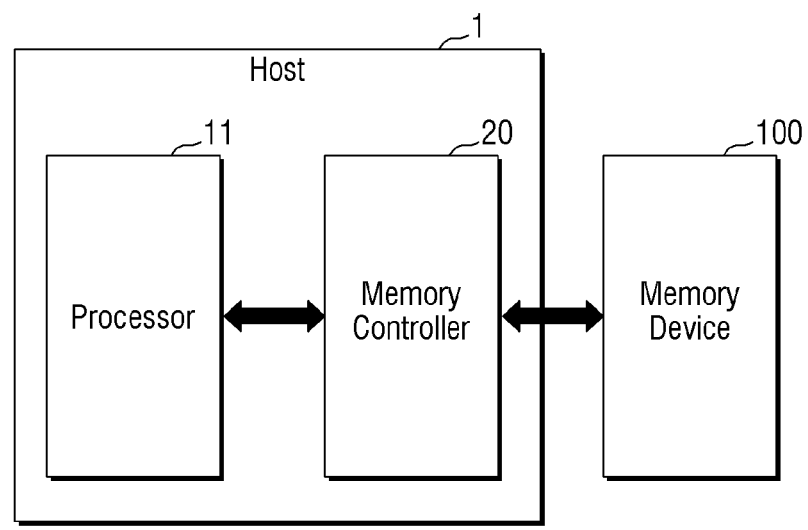

FIG. 1a and FIG. 1b are block diagrams illustrating an electronic system.

Here, the electronic system generally includes a host 1 and a memory system 2.

In some embodiments, the memory system 2 includes a memory controller 20 and at least one memory device 100 described in FIG. 1a.

The host 1 may communicate with the memory system 2 using one or more interface protocol(s) such as PCI-E (Peripheral Component Interconnect-Express), ATA (Advanced Technology Attachment), SATA (Serial ATA), PATA (Parallel ATA), SAS (serial attached SCSI), USB (Universal Serial Bus), MMC (Multi-Media Card), ESDI (Enhanced Small Disk Interface), IDE (Integrated Drive Electronics), etc.

In some embodiments of FIG. 1b, the host 1 includes a processor 11 and the memory controller 20. The processor 11 may control the overall operations of the electronic system, more specifically, the operations of other components that make up the electronic system. Such the processor 11 may be implemented as a general purpose processor, a dedicated processor, an application processor, or the like.

The processor 11 may include one or more CPU cores, and may further include the memory controller 20 for controlling at least one of the memory device 100. Depending on the embodiments, the processor 11 may further include an accelerator block, which is a dedicated circuit for a high-speed data computation such as an AI (artificial intelligence) data computation. Such an accelerator block may include a GPU (Graphics Processing Unit), an NPU (Neural Processing Unit) and/or a DPU (Data Processing Unit), and the like, and may be implemented as separate chips that are physically independent of other components of the processor 11.

The memory controller 20 may be used to control operation of the memory device 100, including data communication (e.g., transmitting and/or receiving) between the host 1 and the memory device 100. For example, the memory controller 20 may control operation of the memory device 100 during write operations and read operation in response to various requests (e.g., memory system commands) received from the host 1.

The memory controller 20 may control operation of the memory device 100 by generating and/or providing various memory device command(s), address(es) and/or control signal(s) to the memory device 100.

Here, the memory device(s) 100 may be one or more of a DRAM, a DDR SDRAM (Double Data Rate Synchronous Dynamic Random Access Memory), a LPDDR (Low Power Double Data Rate) SDRAM, a GDDR (Graphics Double Data Rate) SDRAM, and a RDRAM (Rambus Dynamic Random Access Memory).

The memory controller 20 may communicate with the memory device based on one of the interface standards, for example, a double data rate (DDR), a low power double data rate (LPDDR), a graphics double data rate (GDDR), a wide I/O, a high bandwidth memory (HBM), a hybrid memory cube (HMC), and the like.

In some embodiments, the memory controller 20 and the memory device 100 may be connected via corresponding command pin(s), address pin(s), and/or data pin(s). The command pin(s) may be used to communicate memory device command signal(s) CMD received via a command transmission line(s). The address pin(s) may be used to communicate address signal(es) ADDR via address transmission line(s), and the data pin(s) may be used to communicate data DQ via data transmission line(s). For example, the memory device 100 transmits a read data strobe signal RDQS and a data signal DQ via the pins, and the memory controller 20 transmits a command/address signal C/A, a write data strobe signal WDQS and a data signal DQ via the pins.

In response to a write request received from the host 1, the memory controller 20 may provide a write address to the memory device 100 via the address pin(s), and may provide write data to the memory device 100 via the data pin(s). In response to a read request received from the host 1, the memory controller 20 may provide a read address to the memory device 100 via the address pin(s), and may receive read data from the memory device 100 via the data pin(s).

It is common form the memory controller to access (e.g., read or write) data on a row by row basis. That is, given a memory cell array of the memory device 100, wherein constituent memory cells are arranged (physically and/or logically) according to rows and columns, the memory controller 20 may repeatedly activate a specific row (e.g., a Row k, where 'k' is a positive integer). (Hereafter, the specific row activated in relation to a data access operation may be referred to as a "target row"). Such activation (e.g., electrical disturbances associated with the execution of data access operations) will certainly (and quite intendedly) affect the memory cells of the target row (Row k). However, such activation will also affect the memory cells of rows adjacent to (or proximate to) the target row (e.g., Row(s) k±n, where 'n' is a positive or negative integer). (Hereafter, an adjacent (or proximate) row unintentionally affected by a data access operation directed to the target row may be referred to as an "adjacent row"). For example, electrical disturbances associated with the execution of data access operation(s) directed to a target row of a volatile memory device may inadvertently cause bit flip(s) in memory cells of one or more adjacent row(s).

In this regard, the memory controller 20 may communicate status information of the memory device 100 to the host 1 via the data transmission line(s), and the host 1 may control operation of the memory device 100 in response to the status information received from the memory controller 20. For example, the host 1 (through the memory controller 20) may communicate a refresh command to the memory device 100. Alternately or additionally, the host 1 may allow the memory device 100 to perform a scrubbing operation. Alternately or additionally, the host 1 may transfer data of an adjacent row in the memory device 100 to a previously designated "redundant row."

Figure 2:
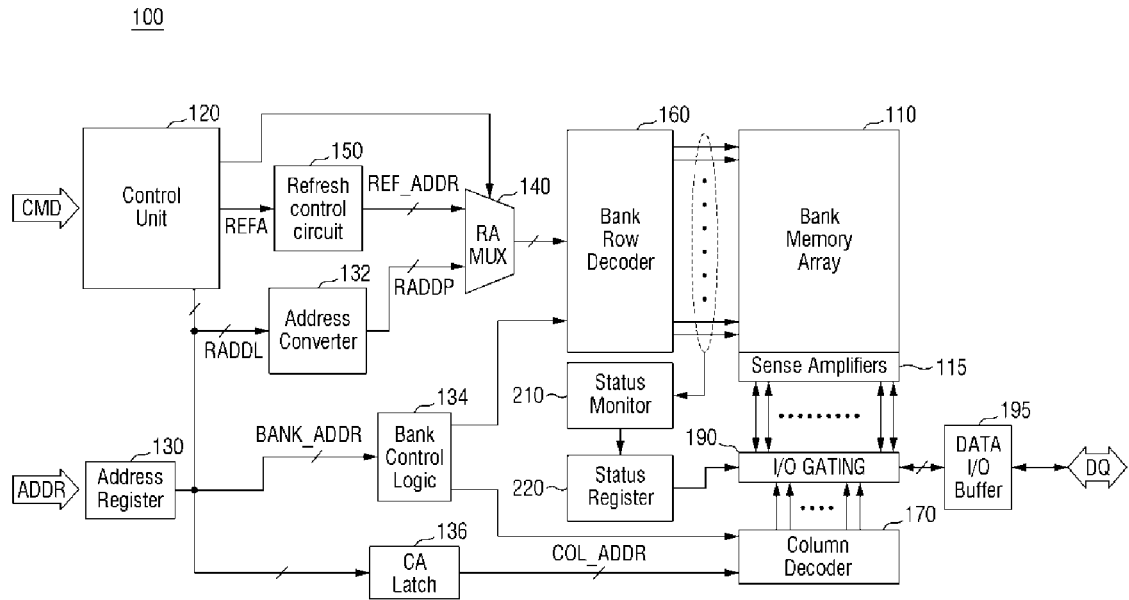
FIGS. 2, 3 and 7 are respective block diagrams further illustrating the memory device 100 of FIG. 1 according to various embodiments of the inventive concept.

FIG. 2 is a block diagram further illustrating in one example the memory device 100 of FIG. 1 according to embodiments of the inventive concept.

Referring to FIG. 2, the memory device 100 may include a control unit 120, an address register 130, a bank control logic 134, a row address multiplexer (RA MUX) 140, a column address latch (CA LATCH) 136, a row decoder, a column decoder, a bank memory array 110, a sense amplifier, an input/output (I/O) gating circuit 190, a data I/O buffer 195, an address conversion circuit 132, a status monitor 210, a status register 220, and a refresh control circuit 150.

The bank memory array 110 may include memory cells divided (physically and/or logically) into memory blocks, wherein respective memory blocks may have physical characteristics that vary. For example, the operating speeds of a first memory block may be different the operating speed of a second memory block among the memory blocks. Each memory block may include a number of pages, wherein in some embodiments, each page includes a single row of memory cells.

In some embodiments, the row decoder may include bank row decoders 160 variously connected to the bank memory array 110, and the column decoder may include bank column decoders 170 variously connected to the bank memory array 110. The sense amplifier may include bank sense amplifiers 115 variously connected to the bank memory array 110.

In some embodiments, each one of the bank memory array 110, the bank sense amplifiers 115, the bank row decoder 160 and the bank column decoder 170 may constitute a number of banks, respectively. Accordingly, in some embodiments, the memory device 100 may be understood as including a number of banks.

The control unit 120 may control operation of the memory device 100. For example, the control unit 120 may generate control signals, such that the memory device 100 performs a write operation, a read operation, or a refresh operation. That is, in response to a request received from the host 1, the memory controller 20 may generate a command (CMD), an address (ADD) and/or control signals controlling the operation of the memory device 100. Alternately or additionally, the control unit 120 may generate control signals controlling one or more self-operation(s) performed by the memory device 100 under defined conditions. For example, the control unit 120 may generate control signal controlling the operation of the status monitor 210 and/or the status register 220.

The address register 130 receive an address signal ADDR from the memory controller 20. Here, the address signal ADDR may include a bank address BANK_ADDR, a logical row address RADDL and a column address COL_ADDR from the memory controller 20. Thus, the address register 130 may provide the bank address BANK_ADDR to the bank control logic 134, the logical row address RADDL to the address conversion circuit 132 and the control unit 120, and the column address COL_ADDR to the column address latch 136.

The control unit 120 may receive the logical row address RADDL and generate various control signals associated with the operation of the memory device 100. For example, the logical row address RADDL may be an address indicating a target row performing a refresh operation or performing a data access operation.

The address conversion circuit 132 converts the logical row address RADDL into a physical row address RADDP associated with a memory cell row of the bank memory array 110, and provides it to the row address multiplexer 140. The address conversion circuit 132 may include an address mapping table that correlates a logical row address RADDL and a corresponding physical row address RADDP for each memory cell row of the bank memory array 110. Thus the address mapping table may be used to convert a logical row address RADDL into the corresponding physical row address RADDP.

The bank control logic 134 may generate bank control signals in response to the bank address BANK_ADDR. In response to the bank control signals, a particular bank row decoder corresponding to the bank address BANK_ADDR from among the bank row decoders 160 may be activated, and the bank column decoder corresponding to the bank address BANK_ADDR from among the bank column decoders 170 may also be activated.

The row address multiplexer 140 may receive the physical row address RADDP from the address conversion circuit 132, and may receive a refresh row address REF_ADDR from the refresh control circuit 150. In some embodiments, the row address multiplexer 140 may selectively output the physical row address RADDP or the refresh row address REF_ADDR in response to the refresh signal REFA. The refresh signal REFA may be generated in response to the refresh command Alternately, the refresh signal REFA may be internally generated in accordance with self-operation of the memory device 100. As an example, the refresh signal REFA may be a signal generated in response to the refresh command REF CMD and the logical row address RADDL by the control unit 120, or a signal generated by self-operation according to the defined conditions in response to the logical row address RADDL by the control unit 120.

The refresh control circuit 150 may output a target row address REF_ADDR as part of performing a refresh operation in accordance with the refresh signal REFA.

Hence, the row address provided by the row address multiplexer 140 may be applied to each of the bank row decoders 160. The bank row decoder activated by the bank control logic 134 among the bank row decoders 160 may decode the row address that is output from the row address multiplexer 140 to output a word line corresponding to the row address. For example, the activated bank row decoder may apply a word line drive voltage to the word line corresponding to the row address.

The memory device 100 may perform a refresh operation in low units in accordance with the refresh signal REFA. In this context, the term "refresh operation" denotes an operation in which information stored in memory cells associated with the refresh row address REF_ADDR is read, and the information may thereafter be restored (or recharged).

The column address latch 136 may receive the column address COL_ADDR from the address register 130 and temporarily store the column address COL_ADDR. Further, the column address latch 136 may gradually increase the column address COL_ADDR in a burst mode. The column address latch 136 may apply a temporarily stored or gradually increased column address COL_ADDR to each of the bank column decoders 170.

Among the bank column decoders 170, the bank column decoder activated by the bank control logic 134 may activate the sense amplifier corresponding to the bank address BANK_ADDR and the column address COL_ADDR through the I/O gating circuit 190.

In some embodiments, the status monitor 210 may monitor the row-specific status information for memory cells of the bank memory arrays 110. That is, it is possible to monitor the status information for memory cells of a word line driven (or activated) from among the word lines of an activated bank. In some embodiments, the status monitor 210 may count (e.g., increment) a number (or frequency) of activations for each word line, as each word line is activated. Alternately or additionally, in some embodiments, the status monitor 210 may monitor, as status information, various types of environmental information affecting the reliability of the data stored in the memory cells, depending on the operation of the memory device. For example, a so-called "Row Hammer count" (R/H count) may be included as environmental information included in the status information.

In some embodiments, the status monitor 210 may monitor the row-specific status information of the memory cell in real time, and store the resulting status information in the status register 220. In this regard, the status monitor 210 may provide status information for memory cells of a target row and/or memory cells of an adjacent row from the status register 220 via the data I/O buffer 195. For example, the status monitor 210 may control the status register 220 to provide status information stored in the status register 220 via the data bus (DQ bus), while the memory device 100 receives the refresh command and the memory device internally performs the refresh command During this period, specific row status information associated with the target row performing the refresh command may be provided and/or specific row status information associated with one or more adjacent rows may be provided. Here, the number of adjacent rows(s) and/or the physical relationship(s) between the adjacent row(s) and the target row may be defined by preset control data.

In some embodiments, the status register 220 may store and output the status information associated with memory cells of the bank memory array 110 under the control of the status monitor 210. That is, the status register 220 may store status information for memory cells associated with a word line indicated by the row address during an operation—e.g., a word line driven by the bank row decoder 160 in the bank memory array 110 under the control of the status monitor 210. In this regard, the row address may be output by the row address multiplexer 140. In some embodiments, when the row address is the physical row address RADDP from the address conversion circuit 132, the status register 220 may store the status information for memory cells associated with the row address (the target row), as well as status information for memory cells associated with adjacent row(s) under the control of the status monitor 210.

In some embodiments, when the row address is a refresh row address REF_ADDR from the refresh control circuit 150, the status register 220 may output status information for memory cells associated with one or more adjacent row address(es), as well as the refresh row address REF_ADDR (target row) stored in the status register 220 to the data I/O buffer 195 under the control of the status monitor 210.

The status information may include various types of information, such as environmental information possibly affecting the reliability of the data stored in the memory cells depending on operation of the memory device. In some embodiments, the status information includes at least one of; an activation count number, a row hammer level (or RH level), a bit error count number.

Further in this regard, when a target row is repeatedly activated in the bank memory array 110, the memory cells of one or more adjacent rows affected by the so-called "row hammer phenomenon" may suffer from an unintended bit flip. Hence, the memory controller 20 may request status information in order to accurately predict the possibility of occurrence for the row hammer phenomenon.

In some embodiments, a row hammer level may be calculated in relation to a current number of activation counts, as compared with a maximum number of activation counts for the target row (or adjacent row). For example, in some embodiments, the memory device 100 may update a number of activation commands directed to each row each time activation is performed on the bank memory array 110. Using the counted number of activation commands, a row hammer level may be calculated, and the memory device 100 may store the calculated row hammer level in the status register 220.

The I/O gate circuit 190 may include input data mask logic, read data latches storing data output from the bank memory array 110, and write drivers writing data to the bank memory arrays 110, along with the circuits for gating the I/O data.

Read data DQ read from at least one bank array among the bank memory arrays 110 may be detected by the sense amplifier corresponding to the at least one bank array and stored in the read data latches. The read data DQ stored in the read data latches may be provided to the memory controller 20 via the data I/O buffer 195.

Write data DQ written to at least one bank array among the bank memory arrays 110 may be provided to the data I/O buffer 195 from the memory controller 20. The write data DQ provided to the data I/O buffer 195 may be written to the at least one bank array via the write drivers. Here, read data and/or write data communicated via the data I/O buffer 195 may transmitted and/or received in defined burst units associated with a burst mode of operation (e.g., a 16-bit burst mode).

Figure 3:
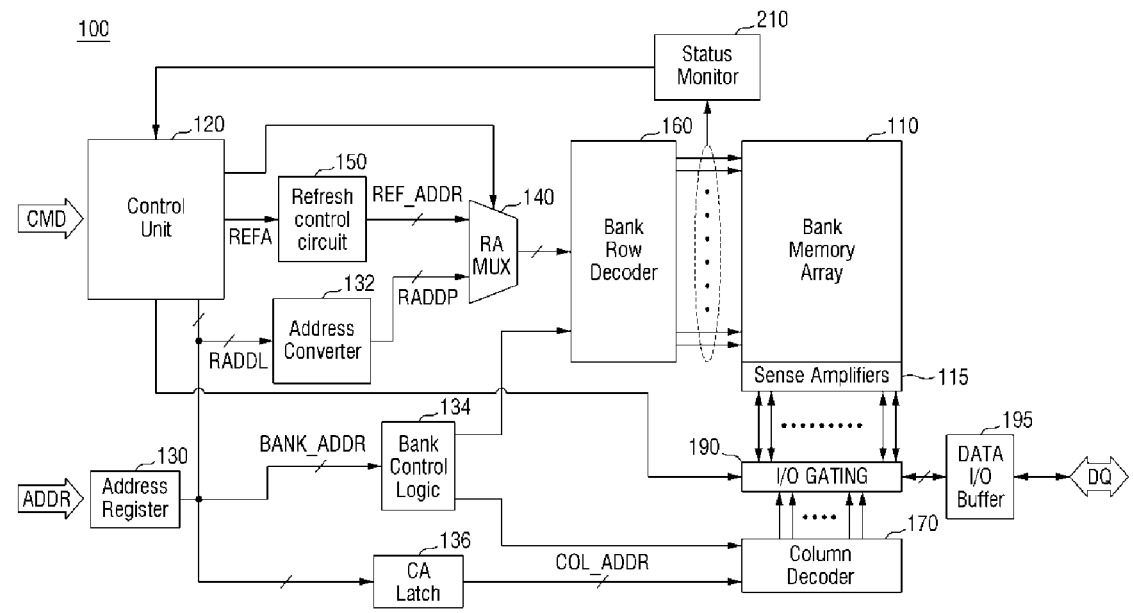
Figure 4:
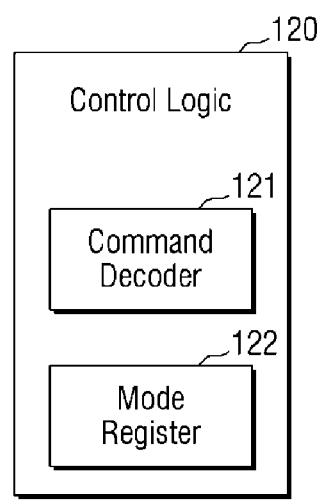
FIG. 4 is a block diagram further illustrating in one example the control unit 120 of FIG. 3.

FIG. 3 is a block diagram illustrating in another example the memory device 100 of FIG. 1 according to embodiments of the inventive concept, and FIG. 4 is a block diagram further illustrating in one example the control unit 120 of FIG. 3. Here, the illustrated embodiment of FIG. 3 materially differs from the embodiment of FIG. 2 in that the status monitor 210 is omitted, and the operation of the status monitor 210 is more directly related to the control unit 120. Thus, status information for the memory cells of the bank memory array 110 may be stored in the control unit 120.

In some embodiments, the status monitor 210 may monitor the row-specific status of the memory cells in each bank of the bank memory array 110. That is, it is possible to monitor status information for a driven word line from among the word lines associated with an activated bank among the banks of the bank memory array 110.

In some embodiments, the status monitor 210 may update a number (or frequency) of activation counts for each activation of a word line among the word lines. Alternately or additionally, the status monitor 210 may monitor environmental information possibly affecting the reliability of the data stored in the memory cells, as status information. For example, a Row Hammer (R/H) count may be included as status information.

In some embodiments like the one shown in FIG. 4, the control unit 120 may include a command decoder 121 capable of decoding commands CMD received from the memory controller 20, and a mode register 122 capable of setting an operating mode for the memory device 100. For example, the command decoder 121 may decode a write enable signal (/WE), a row address strobe signal (/RAS), a column address strobe signal (/CAS), a chip selection signal (/CS), and the like to generate the control signals corresponding to the command CMD. Further, the control unit

120 may further receive a clock signal CLK and a clock enable signal (/CKE) for driving the memory device 100 in a synchronous manner.

In some embodiments, when the memory device 100 receives a refresh command from the host 1, the control unit 120 may communicate a control signal REFA for driving the target row with a refresh voltage to the bank row decoder 160 in response to the logical row address RADDL.

The mode register 122 may store various setting values necessary to the control of various operating modes for the memory device 100. In this regard, various mode registers are described in publicly available technical standards promulgated by JEDEC, such as the DDR5 SDRAM Standard. Further in this regard, the mode register 1222 may be defined by one or more technical standards subsequent to JESD79-5.

The mode register 122 may store row-specific status information for memory cells of the bank memory array 110 in a variety of ways. For example, the mode register 122 may store the row-specific status information for memory cells monitored by the status monitor 210 while the memory device 100 is operating in one or more modes. As noted above, status information may include various types of information, such as environmental information that may possibly affect the reliability of the data stored in the memory cells depending on operation of the memory device 100. Thus, in some embodiments, status information may include at least one of a number of activation counts, a row hammer level (or RH Level), a number of bit error counts, etc.

In some embodiments, the mode register 122 may provide status information according to one or more logical row addresses RADDL associated with the target row and/or an adjacent row to the data I/O buffer 190 in response to a mode register read (MRR) command. The MRR command may be issued in relation to (1) a refresh command from the memory controller 20, (2) a separate request from the memory controller 20, (3) a periodic or non-periodically command from the memory controller 20 under the control of the status monitor 210, etc.

Alternately or additionally, status information may be stored in a separate register (not shown) accessed by the control unit 120. In this case, the status information may be provided through the data I/O buffer 195 in response to a read command directed to the separate register. The separate register read command may be issued in relation to (1) a refresh command from the memory controller 20, (2) a separate request from the memory controller 20, (3) a periodic or non-periodically command from the memory controller 20 under the control of the status monitor 210, etc.

Figure 5:
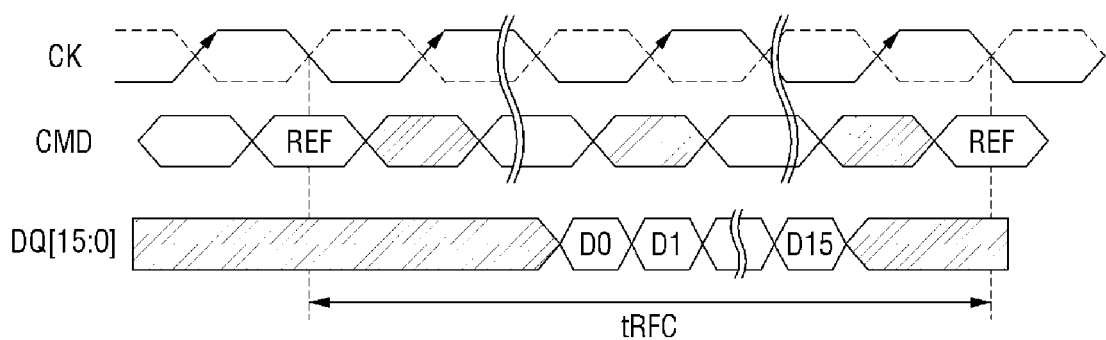
FIGS. 5 and 6 are respective timing diagrams illustrating operation of the memory device according to embodiments of the inventive concept.
Figure 6:
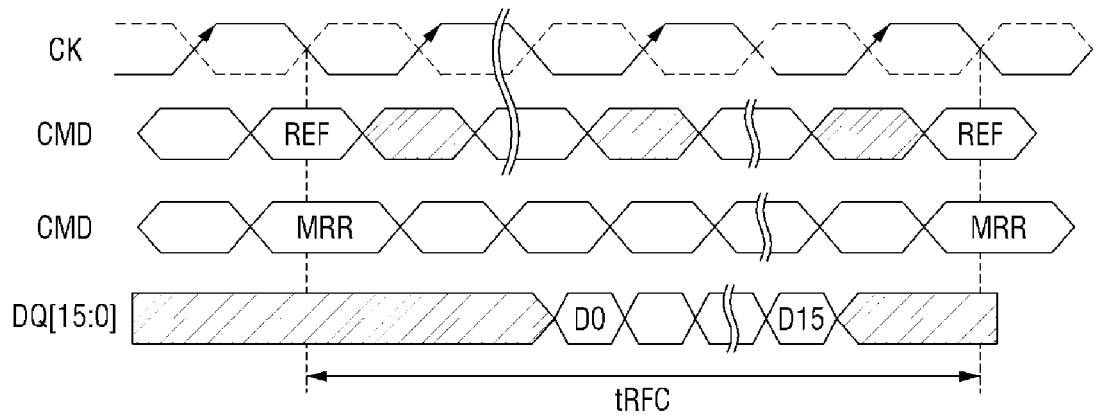

FIGS. 5 and 6 are respective timing diagrams illustrating operation of the memory device 100 according to embodiments of the inventive concept.

Referring to FIG. 5, the memory device 100 may perform a refresh operation on the bank memory array 110 during a refresh operation period tRFC. Here, it is assumed that the refresh operation refreshes all rows indicated by a single refresh command REF CMD according to a refresh operation cycle during the refresh operation period tRFC (e.g., a row refresh cycle time). The refresh operation period tRFC is a time between adjacent refreshes cycles, sufficient to avoid loss of data for any row. The refresh operation may refresh at least one row (e.g., the target row) of the rows refreshed in response to the refresh command.

When the memory device 100 receives the refresh command REF CMD, it may output status information for the "target row of the refresh operation" (that is, the row being refreshed by the refresh operation) and "an adjacent row of the refresh operation" (that is, a row adjacent or proximate to the target row) through the DQ bus DQ [15:0]. At this time, the status information may be output to the memory controller 20 within the refresh operation period tRFC in response to the refresh command.

In some embodiments, status information may be monitored and stored by the memory device 100 in real time. That is, when the memory device 100 receives a refresh command, the memory device 100 may output status information associated with both the target row and the adjacent row through the DQ bus. In this regard, status information may be monitored in real time by the status monitor 210, and when a refresh command or separate request is received, the status information may be output through the DQ bus under the control of the status monitor 210. The status information may be stored in the status register 220, in the mode register 122 of the control logic 120, or in a separate register (not shown).

In some embodiments, status information may include at least one of a row-specific row hammer level and a bit error level of the memory cells. Status information may include at least one or more bits, and some bits may be zero-padded or random bits may be padded, depending on the DQ bus size, when output to the DQ bus. For example, assuming a burst DQ bus size of 16 bits, the status information may be provided without a separate request, and the remaining bit portions, excepting the status information, may be zero-padded or filled with random bits. In some particular examples, the row hammer level 2 bits, bit error level 2 bits and the remaining 12 bits may be zero-padded or random bits padded. Alternately, again assuming a burst DQ bus size of 16 bits, only status information of the request type requested by the host may be provided, and the remaining portions may be zero-padded or random bits padded. For example, the row hammer level 2 bits and the remaining 14 bits may be zero-padded or random bits padded.

Referring to FIGS. 3, 4 and 6, when status information is stored in the mode register, the mode register 122 may store the status information for each row of memory cells in real time while the memory device 100 is operating.

When the control unit 120 receives the refresh command REF CMD, the control unit 120 may internally output the mode register read command MRR CMD, and the mode register 122 may output the status information stored in the mode register 122 to the memory controller 20 according to the MRR command. The MRR command may be defined, for example, in the JEDEC DDR5 SDRAM Standard.

In some embodiments, the mode register 122 may output status information DQ[15:0] of row that is adjacent to the target row. In some embodiments, the mode register 122 may output at least status information of the request type requested by the host from among a variety of status information types.

Figure 7:
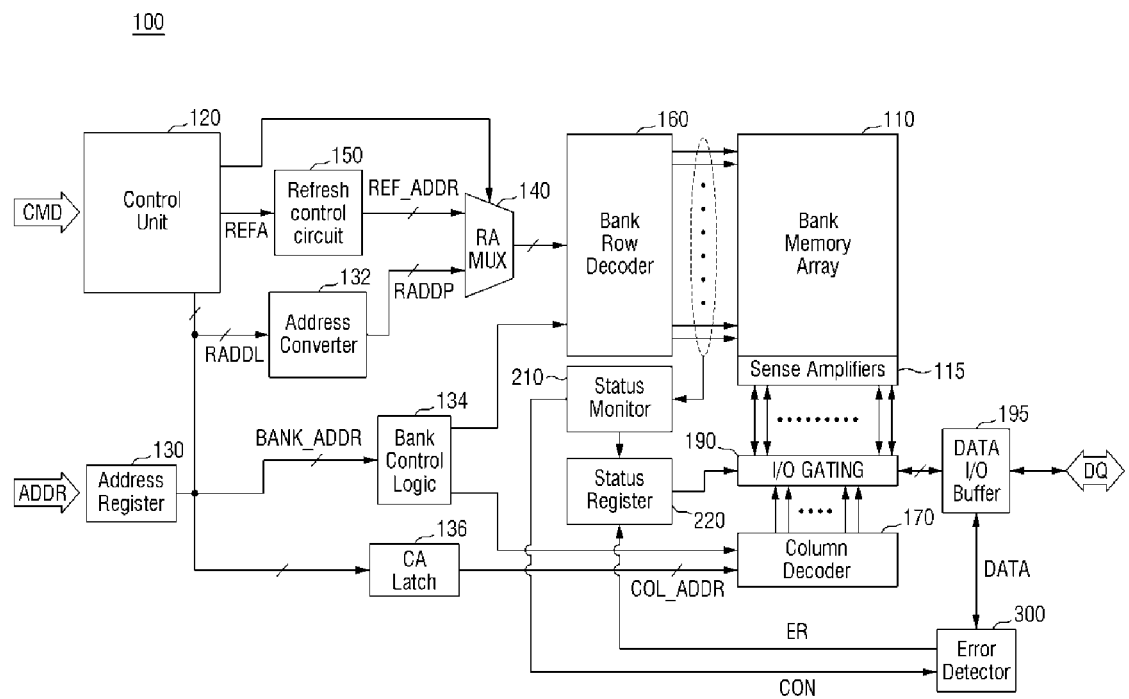

FIG. 7 is a block diagram further illustrating in yet another example the memory device 100 of FIG. 1 according to embodiments of the inventive concept. For convenience of explanation, only material differences with the embodiment illustrated in FIG. 2 will be highlighted.

The memory device 100 of FIG. 7 may further include an error detector 300. The error detector 300 may detect error(s) in read data retrieved from the bank memory array 110 and output by the data I/O buffer 195 during a read operation.

In some embodiments, when a single bit error occurs in the read data, the error detector 300 may detect and correct the error. The error detector may also count the number of codewords in which the error has occurred, and then provide the status monitor 210 with the counted number of (errant) codewords. The status monitor 210 may store the counted number of codewords as a number of bit errors in the status register 220.

The number of bit errors may be the number of errant bits of page data of an activated row of the bank memory array 110. Alternately or additionally, the number of bit errors may be the number of errant bits of data in each memory cell of an activated row of the bank memory array 110. The memory device 100 may perform error detection on read data retrieved from the bank memory array 110, and may then perform the error correction when a single bit error occurs as a result of the error detection. The memory device 100 may count the number of error-corrected codewords, calculate the bit error level, and store it in the status register 220. In some embodiments, the error detector 300 may communicate the error bit level (ER) corresponding to the number of codewords to the status register 220 in response to a control signal CON provided by the status monitor 210. In this case, the status register 220 may store the error bit level as status information.

Alternately or additionally, when the error detector 300 communicates the number of codewords (or the number of bit error counts ER) to the status register 220 in response to the control signal CON provided by the status monitor 210, the status register 220 may also store the error bit level corresponding to the number (ER) of codewords as status information. For example, the status register 220 may calculate and store the row hammer level or the bit error level as a rate according to a defined standard. Examples of this approach will be described hereafter in relation to FIGS. 9, 10 and 11.

Figure 8:
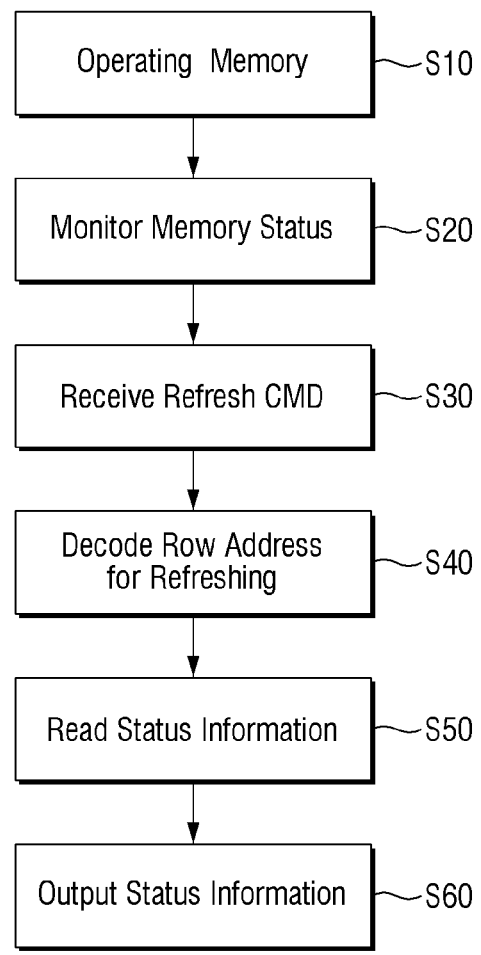
FIGS. 8, 9 and 10 are respective flowcharts variously illustrating methods for operating a memory device according to embodiments of the inventive concept.

FIG. 8 is a flowchart illustrating a method for operating the memory device according to embodiments of the inventive concept.

Referring to FIGS. 1, 2, 3, 7 and 8, during operation of the memory device 100 (S10), the status of memory cells may be monitored (S20). Activation of the memory device 100 and/or monitoring of the memory cells may arise from command(s) issued by the memory controller 20 or from self-operation of the memory device 100. Status information resulting from the monitoring of the memory cells may be stored in the status register 220, in a mode register, and/or in a separate register.

When the memory device 100 receives the refresh command (S30), it decodes the refresh command, extracts the target row, and performs the refresh operation on the target row (S40). Further, the memory device 100 may read status information stored during the refresh operation from the status register 220 (S50). Thus, reading of the status information may occur in response to the refresh command received from the memory controller 20, in response to a register read command received from the memory controller 20, or in response to a self-operation by the memory device 100. Here, the status information may include status information for the target row and/or one or more adjacent row(s), wherein the number (or range) of the adjacent row(s) may be determined according to the status information.

The memory device 100 then output the status information to the memory controller 20 (S60).

Figure 9:
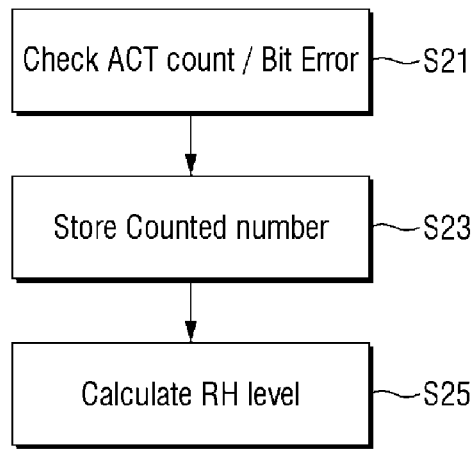

FIG. 9 is a flowchart illustrating in one example the step of monitoring the memory status (S20) in the method of FIG. 8 according to embodiments of the invention concept.

Here, it is assumed that the status information includes information possibly affecting the reliability of the data stored in the memory cells, such as a row hammer level and/or a bit error level.

Referring to FIGS. 1, 2, 3, 7 8 and 9, the memory device 100 may count a number of activation commands for each row when activation is performed on the memory cell array (S21). For example, the status monitor 210 may count the number of activation commands. The memory device 100 may store the counted number of activation commands (S23) in at least one of the status register 220, a mode register and a separate register, and may calculate the row hammer level on the basis of the number of stored activation commands (S25). The memory device 100 may store the calculated row hammer level RH level in the status register 220.

In some embodiments, the memory device 100 may detect data error(s) each time data is read from the bank memory array 110 in order to determine whether a single bit error has occurred (S21). When a single bit error occurs, the memory device 100 may perform an error correction operation, and then, count and store the number of error-corrected codewords (S23). Steps S21 and S23 may be performed, for example, using an error detector implemented in hardware and/or software. The memory device 100 may calculate the bit error level on the basis of the number of stored codewords (S25), and store it, for example, in one of the status register 220, the mode register or a separate register.

Figure 10:
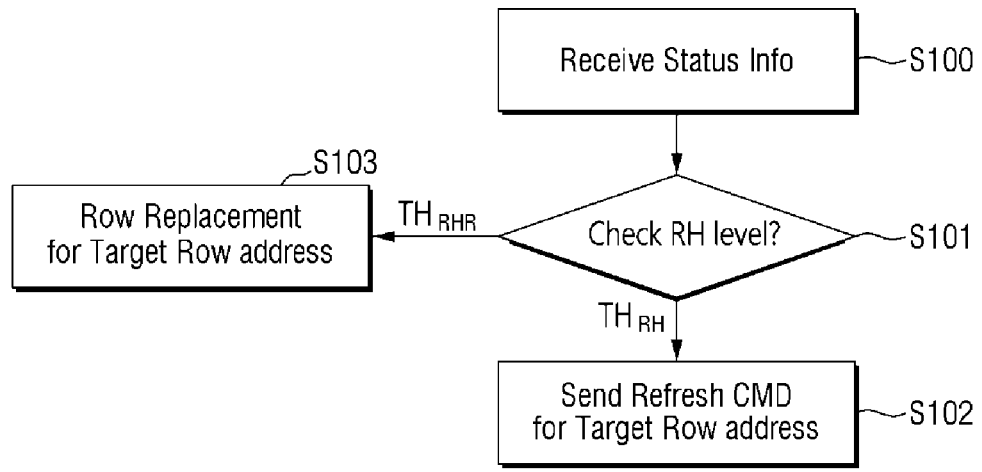
Figures 11, 12:
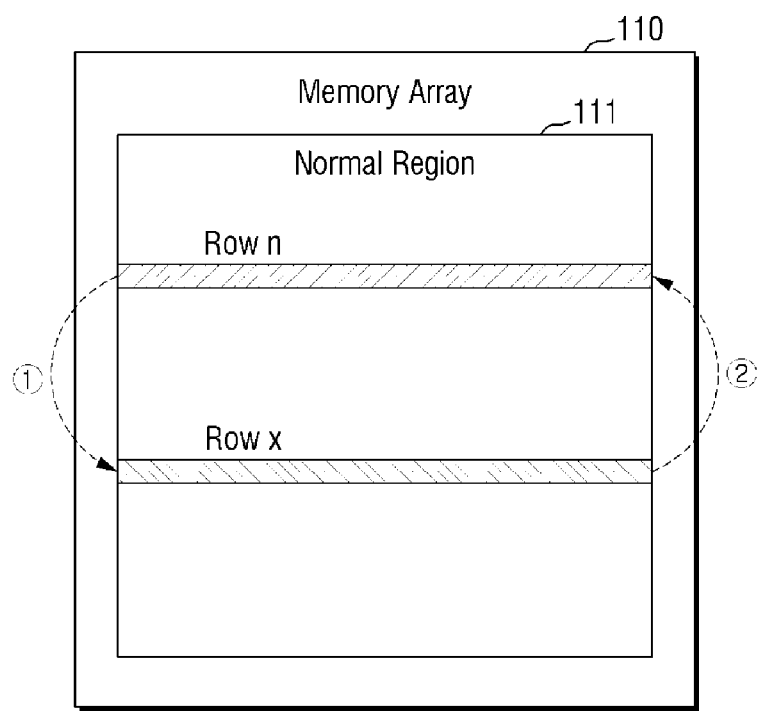
FIG. 11 is a table listing conditions for a refresh operation performed by memory devices according to status information.
FIGS. 12 and 13 are respective conceptual diagram illustrating a refresh operation for the memory device of FIG. 10.
Figure 13:
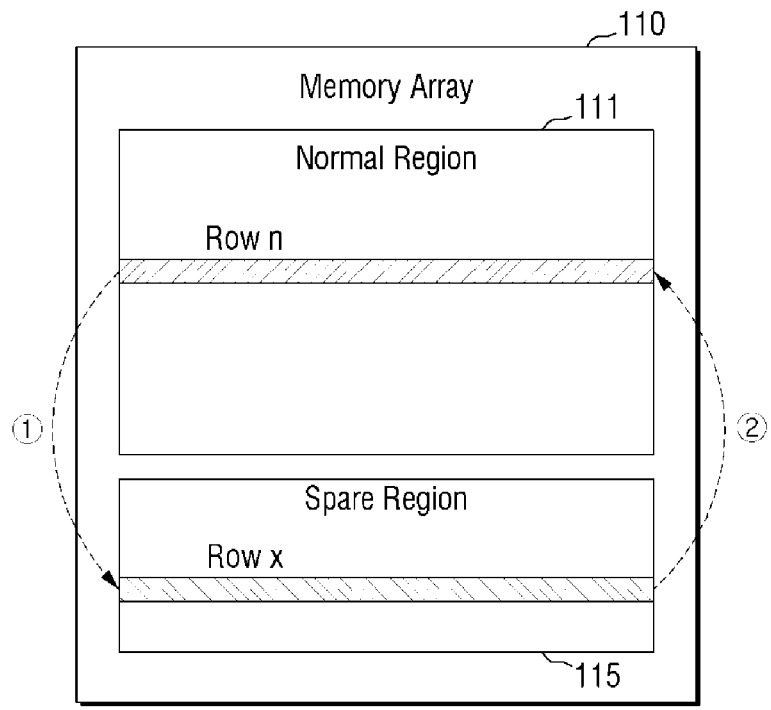

FIG. 10 is a flowchart illustrating a method of operating a memory system according to embodiments of the inventive concept. FIG. 11 is a table listing options for the refresh operation in accordance with status information. FIGS. 12 and 13 are respective conceptual diagrams illustrating execution of the refresh operation by the memory device 100 in accordance with the method of FIG. 10.

Referring to FIGS. 1, 2, 3, 7 and 10, when the host 1 receives status information (e.g., in response to step S60 of the method illustrated in FIG. 8) (S100), the memory controller 20 may checks the status information (S101), and then issue a particular command in response to the status information in order to control on the memory device 100.

In some embodiments, the memory controller 20 may output a refresh command directed to memory cells of an adjacent row to the memory device 100 (S102) in response to the checking of the status information (S101→$TH_{RH}$).

The memory device 100 may store the status information as at least two or more bit values calculated and mapped at a rate according to given row hammer (RH) threshold scale (or standard) $TH_{RH}$. Referring to FIG. 11, a range of the row hammer level may be divided into four sections and mapped to two bits. For example, the row hammer level may be divided according to four threshold levels $TH_{RH}$ (e.g., 0%, 25%, 50% and 75%). As an example, the memory device 100 may calculate the row hammer level as the ratio of a current number of activation counts verses a maximum number of activatable counts for a particular row address. When the ratio is 0%, the memory device 100 may be stored (or mapped) the status information as 00. When the ratio is between 0% and 25%, the status information may be mapped as 01. When the ratio is between 25% and 50%, the status information may be mapped as 10, and when the ratio is between 50% and 75%, the status information may be mapped as 11. Once mapped, these values may be output to the memory controller 20.

The memory controller 20 may control the memory device 100 on the basis of the value of the row hammer level. For example, when the row hammer level received from the memory device is 10, the memory controller 20 may output the refresh command to the memory device to perform a refresh operation on an adjacent row (e.g., Row (n±1), given a target Row n). When the row hammer level is 11, the memory controller 20 may output the refresh command to the memory device to perform the refresh operation on at least two adjacent rows (e.g., Row (n±1) and Row (n±2)). That is, it is possible to control an appropriate range for the adjacent row(s) in accordance with the row hammer level.

Referring to FIG. 10 and based on the checking of the status information (S101→$TH_{RHR}$), the memory controller 20 may compare the status information with a preset substitution threshold value $TH_{RHR}$. That is, the memory controller 20 may determine whether a particular row (e.g., a target row or an adjacent row) exceeds the substitution threshold value as a replacement target row. Thereafter, the memory controller 20 may replace data stored in the memory cells of the replacement target row with the memory cells of the redundant row (S103). Possible approaches to the replacement by the redundant row will be described hereafter in relation to FIGS. 12 and 13.

Referring to FIG. 12, if the status information satisfies an established replacement condition (e.g., is greater than or equal to a first substitution threshold value $TH_{RHR1}$) the memory device 100 may transfer the data of replacement target row in the bank memory array 110. That is, the target row (Row n) or the adjacent row (Row n±k) may be replaced. Afterwards, the data transferred by the memory device 100 may operate in the memory cell of the redundant row. The transferred redundant row may be placed at a row spaced apart (e.g., by least 5 rows) from the original location of the replaced row (e.g., Row n or Row n±k) within a normal region of the bank memory array 110. Here, the term "normal region" refers to regions of the bank memory array 110 that may be accessed, as compared with dummy region(s) which may not be directly accessed.

Alternately, referring to FIG. 13, the bank memory array 110 may include a spare region 115 outside the normal region 111 to which the redundant row to be transferred. Here, the spare region may include a dummy region or the like, and may be referred to as a redundant region.

In the foregoing embodiments, the memory device 100 may continuously monitor status information while transferring data to the redundant row. If the updated status information satisfies a return condition (e.g., is less than a second substitution threshold value $TH_{RHR2}$), the data may be returned from the redundant row to its original position (that is, the row that was a replacement target). In this regard, the second substitution threshold value may have a value less than the first substitution threshold value ($TH_{RHR2}<TH_{RHR1}$).

In the illustrated embodiments of FIGS. 11, 12 and 13, the memory controller 20 allows the memory device 100 to update the mapping address information for certain data (e.g., mapping information between a physical row address and a the logical row address), until the memory device 100 transfers data to the redundant row (operation 1 in FIGS. 12 and 13), and returns the data to the row which was a replacement target (operation 2 in FIGS. 12 and 13).

Figure 14:
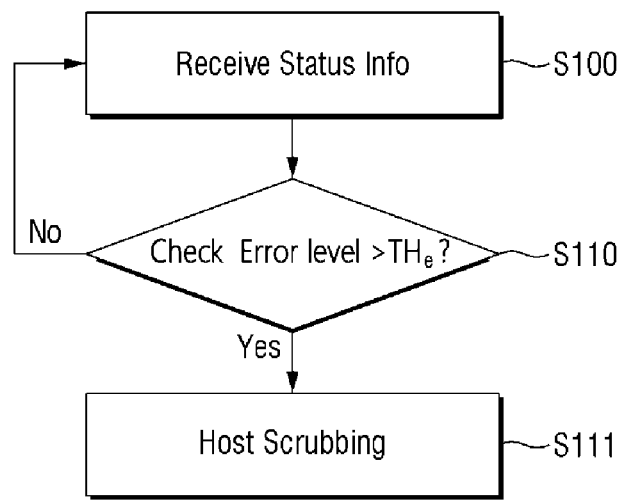
FIG. 14 is a flowchart illustrating a method of operating a memory system according to embodiments of the inventive concept.
Figures 15, 16:
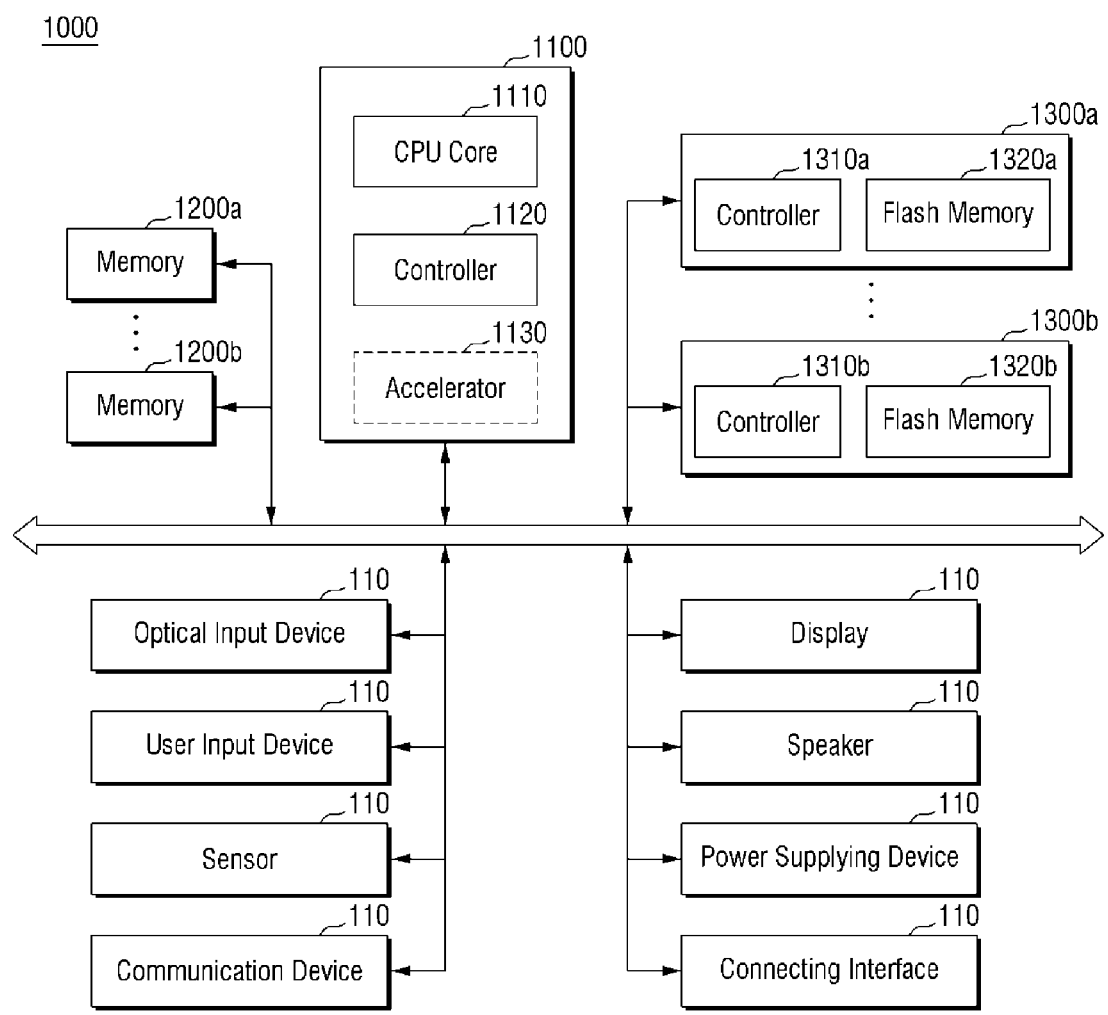
FIG. 15 is a table listing conditions for a refresh operation performed by memory device according to status information.
FIG. 16 is a block diagram illustrating a system including a memory device according to embodiments of the inventive concept.

FIG. 14 is a flowchart illustrating a method for operating a memory system according to embodiments of the inventive concept. FIG. 15 is a table listing conditions for a refresh operation performed by the memory device in response to second status information.

Referring to FIGS. 1, 2, 3, 7 and 14, when the host 1 receives status information (S100), the host may output a data scrubbing command to the memory device (S111) on the basis of checking the status information (S110). The scrubbing command may be performed as shown in FIG. 15 according to various error level thresholds.

In this regard, the memory device 100 may store the status information, as at least two or more bit values calculated and mapped at a rate according to a given range of error level thresholds (or standards) $TH_e$. Referring to FIGS. 14 and 15, a detected bit error level may be divided into four sections and mapped to two bits. For example, the bit error level may be divided into four standards $TH_e$ (e.g., 0%, 25%, 50% and 75%). As an example, the memory device 100 may calculate the bit error level as the number of codewords in which an error has been corrected verses a total number of data bits. When the detected bit error level is 0%, the memory device may store the status information as 00, when the bit error level is between 0% and 25%, the status information may be mapped as 01, when the bit error level is between 25% and 50%, the status information may be mapped as 10, and when the bit error level is between 50% and 75%, the status information may be mapped as 11. Once mapped, the bit error level may be output to the memory controller 20.

The memory controller 20 may control the memory device 100 on the basis of the bit error level. For example, when the bit error level received from the memory device 10 is 10, the memory controller 20 may output the scrubbing command to the memory device 10 to perform a scrubbing operation on the target row and/or an adjacent row. For example, when the received bit error level is 11, the memory controller 20 may output the scrubbing command to the memory device 100 to perform the scrubbing operation on the memory bank including the target row. That is, it is possible to expand the range of the scrubbing operation in relation to the value of the bit error level.

FIG. 16 is a block diagram illustrating a system 1000 including a memory device according to embodiments of the inventive concept.

Here, the system 1000 may be a mobile system, such as a mobile phone, a smart phone, a tablet PC (tablet personal computer), a wearable device, a healthcare device, an IOT (internet of things) device, a personal computer, a laptop computer, a server, a media player, an automotive device, a navigation device, etc.

Referring to FIG. 16, the system 1000 may include a main processor 1100, memories 1200*a* and 1200*b*, and storage devices 1300*a*, 1300*b*, and may additionally include one or more of an image capturing device 1410, a user input device 1420, a sensor 1430, a communication device 1440, a display 1450, a speaker 1460, a power supplying device 1470, and a connecting interface 1480.

The main processor 1100 may control the overall operations of the system 1000, more specifically, the operations of other components that make up the system 1000. Such a main processor 1100 may be implemented as a general purpose processor, a dedicated processor, an application processor, or the like.

The main processor 1100 may include one or more CPU cores 1110, and may further include a controller 1120 for controlling the memories 1200*a* and 1200*b* and/or storage devices 1300*a* and 1300*b*. Depending on the embodiments, the main processor 1100 may further include an accelerator block 1130, which is a dedicated circuit for a high-speed data computation such as an AI (artificial intelligence) data computation. Such an accelerator block 1130 may include a GPU (Graphics Processing Unit), an NPU (Neural Processing Unit) and/or a DPU (Data Processing Unit), and the like, and may be implemented as separate chips that are physically independent of other components of the main processor 1100.

The memories 1200a and 1200b may be used as a main memory unit of the system 1000, and may include a volatile memory such as an SRAM and/or a DRAM, but may also include a nonvolatile memory such as a flash memory, a PRAM and/or a RRAM. When the memories 1200a and 1200b are volatile memories, they may be implemented as the memory device 100 variously described in relation to the foregoing embodiments of the inventive concept. In some embodiments, the memories 1200a and 1200b may also be implemented in the same package as the main processor 1100.

The storage devices 1300a and 1300b may function as nonvolatile storage devices for storing data regardless of whether a power is supplied, and may have a relatively larger capacity than the memories 1200a and 1200b. The storage devices 1300a and 1300b may include storage controllers 1310a and 1310b, and non-volatile memory (NVM) storages 1320a and 1320b that store data under the control of the storage controllers 1310a and 1310b. The nonvolatile memories 1320a and 1320b may include a V-NAND flash memory of a 2D (2-dimensional) structure or a 3D (3-dimensional) structure, but may also include other types of nonvolatile memory such as a PRAM and/or a RRAM.

The storage devices 1300a and 1300b may be included in the system 1000 in a state of being physically separated from the main processor 1100, and may be implemented in the same package as the main processor 1100. Further, since the storage devices 1300a and 1300b have a shape such as an SSD (solid state device) or a memory card, the storage devices 1300a and 1300b may also be detachably coupled with other components of the system 1000 through an interface such as a connecting interface 1480 to be described below. Such storage devices 1300a and 1300b may be, but are not necessarily limited to, devices to which standard protocols such as a UFS (universal flash storage), an eMMC (embedded multi-media card) or an NVMe (nonvolatile memory express) are applied.

The image capturing device 1410 may capture still images or moving images, and may be a camera, a video camera (camcorder), and/or a webcam and the like.

The user input device 1420 may receive various types of data input from users of the system 1000, and may be a touch pad, key pad, a key board, a mouse and/or a microphone.

The sensor 1430 may detect various types of physical quantities that may be acquired from the outside of the system 1000, and convert the detected physical quantities into electrical signals. Such a sensor 1430 may be a temperature sensor, a pressure sensor, an illuminance sensor, a position sensor, an acceleration sensor, a biosensor and/or a gyroscope.

The communication device 1440 may transmit and receive signals to and from other devices outside the system 1000 according to various communication protocols. Such a communication device 1440 may be implemented by including an antenna, a transceiver and/or a modem and the like.

The display 1450 and the speaker 1460 may function as output devices that output visual and auditory information to the user of the system 1000, respectively.

The power supplying device 1470 may appropriately convert the power supplied from a battery (not shown) equipped in the system 1000 and/or an external power supply and supply the power to each component of the system 1000.

The connecting interface 1480 may provide a connection between the system 1000 and an external device that may be connected to the system 1000 to transmit and receive data to and from the system 1000. The connecting interface 1480 may be implemented by various interface types, such as an ATA (Advanced Technology Attachment), a SATA (Serial ATA), an e-SATA (external SATA), a SCSI (Small Computer Small Interface), a SAS (Serial Attached SCSI), a PCI (Peripheral Component Interconnection), a PCIe (PCI express), a NVMe (NVM express), an IEEE 1394, a USB (universal serial bus), an SD (secure digital) card, a MMC (multi-media card), an eMMC (embedded multi-media card), a UFS (Universal Flash Storage), an eUFS (embedded Universal Flash Storage), and a CF (compact flash) card interface.

Figure 17:
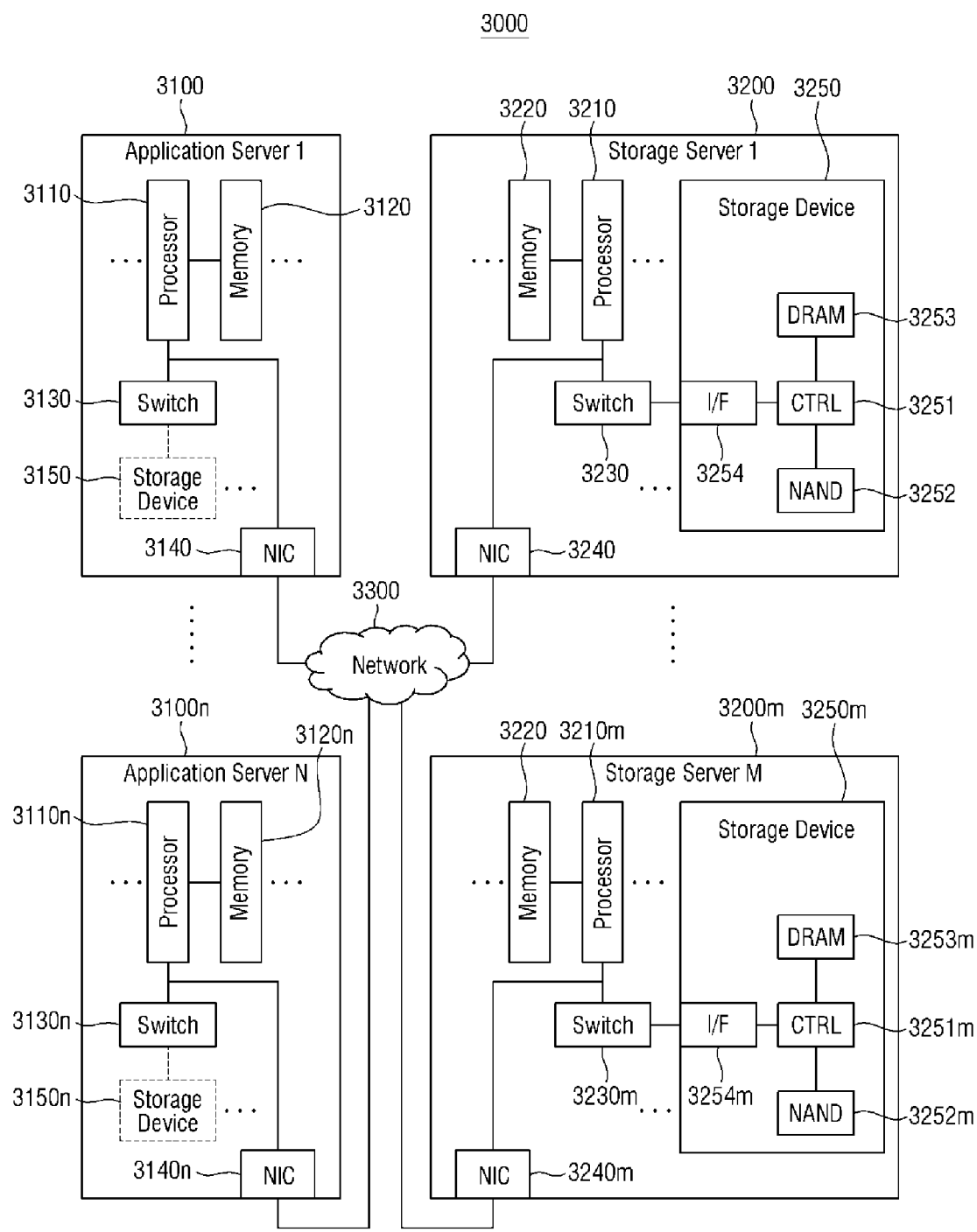
FIG. 17 is a block diagram illustrating a data center including a storage device according to embodiments of the inventive concept.

FIG. 17 is a block illustrating a data center 3000 including a storage device according to embodiments of the inventive concept.

Here, the data center 3000 may be a facility that gathers various types of data and provides services, and may be called a data storage center. The data center 3000 may be a search engine and a system for database operation, and may be a computing system used by corporations such as banks or government agencies. The data center 3000 may include application servers 3100 to 3100n and storage servers 3200 to 3200m. The number of application servers 3100 to 3100n and the number of storage servers 3200 to 3200m may be variously selected depending on the embodiments, and the number of application servers 3100 to 3100n and the number of storage servers 3200 to 3200m may be different from each other.

The application server 3100 or the storage server 3200 may include at least one of the processors 3110 and 3210 and the memories 3120 and 3220. Taking the storage server 3200 as an example, the processor 3210 may control the overall operation of the storage server 3200, and access the memory 3220 to execute command language and/or data loaded into the memory 3220. The memory 3220 may be a DDR SDRAM (Double Data Rate Synchronous DRAM), a HBM (High Bandwidth Memory), a HMC (Hybrid Memory Cube), a DIMM (Dual In-line Memory Module), an Optane DIMM or a NVMDIMM (Non-Volatile DIMM). Depending on the embodiments, when the memories 3120 are 3220 are volatile memories, they may be implemented in accordance with the foregoing embodiments of the inventive concept.

Depending on the embodiments, the number of processors 3210 and the number of memories 3220 included in the storage server 3200 may be variously selected. In an embodiment, the processor 3210 and the memory 3220 may provide a processor-memory pair. In an embodiment, the number of processors 3210 and the number of memories 3220 may be different from each other. The processor 3210 may include a single core processor or a multi-core processor. The aforementioned explanation of the storage server 3200 may also be similarly applied to the application server 3100. Depending on the embodiments, the application server 3100 may not include a storage device 3150. The storage server 3200 may include at least one or more storage devices 3250. The number of storage devices 3250 included in the storage server 3200 may be variously selected depending on the embodiments.

The application servers 3100 to 3100n and the storage servers 3200 to 3200m may communicate with each other through a network 3300. The network 3300 may be implemented, using a FC (Fibre Channel), an Ethernet, or the like. At this time, FC is a medium used for a relatively high-speed data transfer, and may use an optical switch that provides high performance/high availability. The storage servers 3200 to 3200*m* may be provided as a file storage, a block storage or an object storage, depending on the access type of the network 3300.

In an example, the network 1300 may be a storage-only network such as a SAN (Storage region Network). For example, a SAN may be an FC-SAN which uses an FC network and is implemented according to FCP (FC Protocol). In another embodiment, a SAN may be an IP-SAN which uses a TCP/IP network and is implemented according to an iSCSI (SCSI over TCP/IP or Internet SCSI) protocol. In another embodiment, the network 1300 may be a general network such as a TCP/IP network. For example, the network 1300 may be implemented, according to protocols such as an FCoE (FC over Ethernet), a NAS (Network Attached Storage), and an NVMe-oF (NVMe over Fabrics).

Hereinafter, the application server 3100 and the storage server 3200 will be mainly described. The explanation of the application server 3100 may also be applied to another application server 3100*n*, and the explanation of the storage server 3200 may also be applied to another storage server 3200*m*.

The application server 3100 may store the data requested to store by a user or client in one of the storage servers 3200 to 3200*m* through the network 3300. Further, the application server 3100 may acquire the data requested to read by the user or client from one of the storage servers 3200 to 3200*m* through the network 3300. For example, the application server 3100 may be implemented by a Web server or a DBMS (Database Management System).

The application server 3100 may access the memory 3120*n* or the storage device 3150*n* included in another application server 3100*n* through the network 3300, or may access the memories 3220 to 3220*m* or the storage devices 3250 to 3250*m* included in the storage servers 3200 to 3200*m* through the network 3300. Accordingly, the application server 3100 may perform various operations on the data stored in the application servers 3100 to 3100*n* and/or the storage servers 3200 to 3200*m*. For example, the application server 3100 may execute commands for moving or copying the data between the application servers 3100 to 3100*n* and/or the storage servers 3200 to 3200*m*. At this time, the data may be moved from the storage devices 3250 to 3250*m* of the storage servers 3200 to 3200*m* via the memories 3220 to 3220*m* of the storage servers 3200 to 3200*m*, or may be directly moved to the memories 3120 to 3120*n* of the application servers 3100 to 3100*n*. Data which moves through the network 3300 may be data encrypted for security and privacy.

Taking the storage server 3200 as an example, an interface 3254 may provide a physical connection between the processor 3210 and a controller 3251, and a physical connection between the NIC 3240 and the controller 3251. For example, the interface 3254 may be implemented by a DAS (Direct Attached Storage) type in which the storage device 3250 is directly connected with a dedicated cable. Further, for example, the interface 3254 may be implemented by various interface types, such as an ATA (Advanced Technology Attachment), a SATA (Serial ATA), an e-SATA (external SATA), a SCSI (Small Computer Small Interface), a SAS (Serial Attached SCSI), a PCI (Peripheral Component Interconnection), a PCIe (PCI express), a NVMe (NVM express), an IEEE 1394, a USB (universal serial bus), an SD (secure digital) card, a MMC (multi-media card), an eMMC (embedded multi-media card), a UFS (Universal Flash Storage), an eUFS (embedded Universal Flash Storage), and a CF (compact flash) card interface.

The storage server 3200 may further include a switch 3230 and a NIC 3240. The switch 3230 may selectively connect the processor 3210 and the storage device 3250 or may selectively connect the NIC 3240 and the storage device 3250, according to the control of the processor 3210.

In an embodiment, the NIC 3240 may include a network interface card, a network adapter, and the like. The NIC 3240 may be connected to the network 3300 by a wired interface, a wireless interface, a Bluetooth interface, an optical interface, or the like. The NIC 3240 may include an internal memory, a DSP, a host bus interface, or the like, and may be connected to the processor 3210, and/or the switch 3230, or the like through the host bus interface. The host bus interface may also be implemented as one of the examples of the interface 3254 described above. In an embodiment, the NIC 3240 may also be integrated with at least one of the processor 3210, the switch 3230, and the storage device 3250.

In the storage servers 3200 to 3200*m* or the application servers 3100 to 3100*n*, the processors 3110 and 3210 may transmit the commands to the storage devices 3130 to 3130*n* and 3250 to 3250*m* or the memories 3120 to 3120*n* and 3220 to 3220*m* to program or read the data. At this time, the data may be data in which an error is corrected through an ECC (Error Correction Code) engine. The data is data subjected to data bus inversion (DBI) or data masking (DM) process, and may include CRC (Cyclic Redundancy Code) information. The data may be data that is encrypted for security and privacy.

The storage devices 3150 to 3150*m* and 3250 to 3250*m* may transmit the control signal and command/address signal to the NAND flash memory devices 3252 to 3252*m* in response to the read command received from the processor. Accordingly, when data is read from the NAND flash memory devices 3252 to 3252*m*, the RE (Read Enable) signal is input as a data output control signal, and may serve to output the data to the DQ bus. A DQS (Data Strobe) may be generated, using the RE signal. Command and address signals may be latched to the page buffer, depending on a rising edge or a falling edge of a WE (Write Enable) signal.

The controller 3251 may generally control the operation of the storage device 3250. In an embodiment, the controller 3251 may include a SRAM (Static Random Access Memory). The controller 3251 may write data in the NAND flash 3252 in response to a write command, or may read the data from the NAND flash 3252 in response to a read command. For example, the write command and/or the read command may be provided from the processor 3210 in the storage server 3200, the processor 3210*m* in another storage server 3200*m*, or the processors 3110 and 3110*n* in the application servers 3100 and 3100*n*. A DRAM 3253 may temporarily store (buffer) the data to be written in the NAND flash 3252 or the data read from the NAND flash 3252. Also, the DRAM 3253 may store meta data. Here, the meta data is a user data or data generated by the controller 3251 to manage the NAND flash 3252. Depending on the embodiment, the DRAM 3253 may be the memory device described in FIGS. 1 to 15. The storage device 3250 may include an SE (Secure Element) for security and privacy.

Those skilled in the art will appreciate that many variations and modifications may be made to the foregoing embodiments without substantially departing from the scope of the inventive concept. Therefore, the illustrated embodiments are illustrative in nature presented to teach the making and use of the inventive concept.

What is claimed is:

1. A memory device comprising:
a bank memory array including memory cells;
a control unit configured to indicate a target row of the bank memory array in response to a refresh command received from an external source;
a refresh control circuit that provides a refresh row address in response to the control unit indicating the target row;
a row decoder that applies a refresh drive voltage to the refresh row address;
a status monitor that monitors row-specific status information for memory cells of the target row;
a status register that stores the status information under control of the status monitor; and
a data input/output (I/O) buffer that receives the status information from the status register and provides the status information to the external source in response to the refresh command.

2. The memory device of claim 1, wherein the status information includes at least one of a row hammer level and a bit error level.

3. The memory device of claim 2, wherein the control unit is further configured to count a number of activation commands for each row of the bank memory array, and calculate the row hammer level in response to the number of activation commands.

4. The memory device of claim 2, further comprising:
an error detector configured to detect an error in read data retrieved from the bank memory cell array, determine whether a single bit error occurs in the read data, count a number of errant codewords when a single bit error is determined, wherein the bit error level corresponds to the number of errant codewords.

5. The memory device of claim 2, wherein the status register stores the at least one of the row hammer level and the bit error level, as a multiple bit value calculated and mapped at a rate according to a range of threshold standards.

6. The memory device of claim 1, wherein the status information includes multiple types of status information, and the refresh command indicates a type of status information among the multiple types of status information.

7. The memory device of claim 6, wherein the bank memory array performs a refresh operation on the refresh row address, and
the status register outputs status information to the data I/O buffer corresponding to the type of status information among the multiple types of status information.

8. A memory system including a memory controller issuing a first refresh command and a memory device, wherein the memory devices comprises:
a bank memory array including memory cells;
a control unit configured to indicate a target row of the bank memory array in response to the first refresh command;
a refresh control circuit that provides a refresh row address in response to the control unit indicating the target row;
a row decoder that applies a refresh drive voltage to the refresh row address;
a status monitor that monitors row-specific status information for memory cells of the target row;
a status register that stores the status information under control of the status monitor; and
a data input/output (I/O) buffer that receives the status information from the status register and provides the status information to the memory controller in response to the first refresh command, wherein the status information includes at least one of a row hammer level and a bit error level.

9. The memory system of claim 8, wherein the memory controller issues a second refresh command to the memory device in response to a comparison of the row hammer level with a number of row hammer threshold standards.

10. The memory system of claim 9, wherein
the control unit is further configured to indicate an adjacent row of the bank memory array, relative to the target row, in response to the second refresh command;
the refresh control circuit provides another refresh row address in response to the control unit indicating the adjacent row;
the row decoder applies another refresh drive voltage to memory cells of the adjacent rows in response to the another refresh row address; and
the status monitor monitors row-specific status information for memory cells of the adjacent row.

11. The memory system of claim 8, wherein the memory controller issues a scrubbing command to the memory device in response to the status information.

12. The memory system of claim 11, wherein the memory device scrubs memory cells of the target row and memory cells of the adjacent row in response to the scrubbing command and in relation to the bit error level.

13. The memory system of claim 11, wherein the memory device scrubs memory cells of a bank in the bank memory array including the target row in response to the scrubbing command and in relation to the bit error level.

14. The memory system of claim 8, wherein the memory controller compares the status information to a number of substitution threshold values to generate a comparison result, and
relocates data stored in memory cells of a replacement target row to memory cells of a redundant row in response to the comparison result.

15. The memory system of claim 14, wherein the redundant row is spaced apart from the target row, and
the redundant row is included in a redundant region of the bank memory array.

16. A method of operating a memory device, the method comprising:
receiving a refresh command;
performing a refresh operation on a target row of a bank memory array; and
providing status information to a memory controller for an adjacent row, relative to the target row, during a refresh operation period defining a refresh operation performed by the memory device;
wherein the status information includes a row hammer level and a bit error level.

17. The method of claim 16, further comprising:
counting a number of activation commands for rows of the bank memory array, and
calculating the row hammer level in relation to the number of activation commands.

18. The method of claim 16, further comprising:
detecting an error in data stored by memory cells in rows of the bank memory array; and
counting a number of errant codewords including the error, wherein bit error level corresponds to the number of errant codewords.

19. The method of claim 16, further comprising:
performing a scrubbing operation in relation to the status information.

20. The memory system of claim 11, wherein the scrubbing operation includes scrubbing memory cells of the target row and memory cells of the adjacent row.

* * * * *